(12) United States Patent
Danan et al.

(10) Patent No.: US 10,978,600 B1
(45) Date of Patent: Apr. 13, 2021

(54) SYSTEMS AND METHODS FOR ACTIVE SWIR IMAGING USING GERMANIUM RECEIVERS

(71) Applicant: TriEye Ltd., Tel Aviv (IL)

(72) Inventors: Ariel Danan, Tel-Aviv (IL); Omer Kapach, Jerusalem (IL); Uriel Levy, Kiryat-Ono (IL); Avraham Bakal, Tel-Aviv (IL)

(73) Assignee: TriEye Ltd., Tel Aviv (IL)

( * ) Notice: Subject to any disclaimer, the term of this patent is extended or adjusted under 35 U.S.C. 154(b) by 0 days.

(21) Appl. No.: 16/662,665

(22) Filed: Oct. 24, 2019

(51) Int. Cl.
*H01L 31/028* (2006.01)
*G01S 7/484* (2006.01)
*G01S 7/4863* (2020.01)
*G01S 17/89* (2020.01)

(52) U.S. Cl.
CPC ............ *H01L 31/028* (2013.01); *G01S 7/484* (2013.01); *G01S 7/4863* (2013.01); *G01S 17/89* (2013.01)

(58) Field of Classification Search
CPC ....... H01L 31/028; G01S 7/484; G01S 17/89; G01S 7/4863; G01S 7/4811; G01S 7/10; G01S 7/4815; G01S 7/4865; G01S 7/4816; H01S 3/136; H01S 3/117; H01S 3/1305; H01S 3/115
See application file for complete search history.

(56) References Cited

U.S. PATENT DOCUMENTS

| 2008/0121805 | A1 | 5/2008 | Tweet et al. | |
| 2017/0153319 | A1* | 6/2017 | Villeneuve | H01S 3/08086 |
| 2019/0131760 | A1* | 5/2019 | Bane | H01S 3/117 |

FOREIGN PATENT DOCUMENTS

| WO | 2019138301 A1 | 7/2019 |
| WO | 2019155435 A2 | 8/2019 |

* cited by examiner

*Primary Examiner* — David P Porta
*Assistant Examiner* — Mamadou Faye
(74) *Attorney, Agent, or Firm* — Nathan & Associates; Menachem Nathan

(57) ABSTRACT

An active imaging system comprising an illumination source for emitting a radiation pulse towards a target resulting in radiation reflected from the target, a receiver comprising one or more germanium photodiodes for receiving the reflected radiation, and a method for using same.

22 Claims, 7 Drawing Sheets

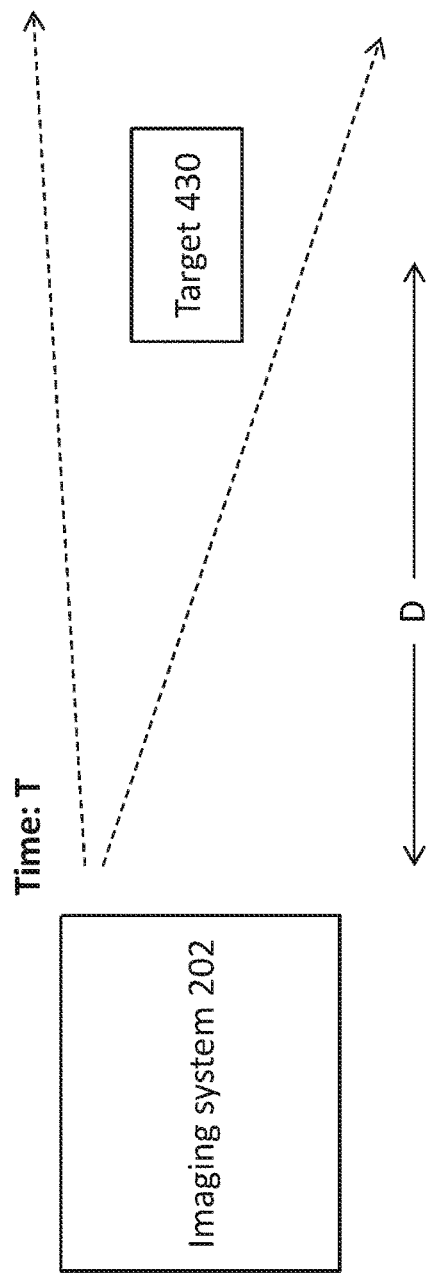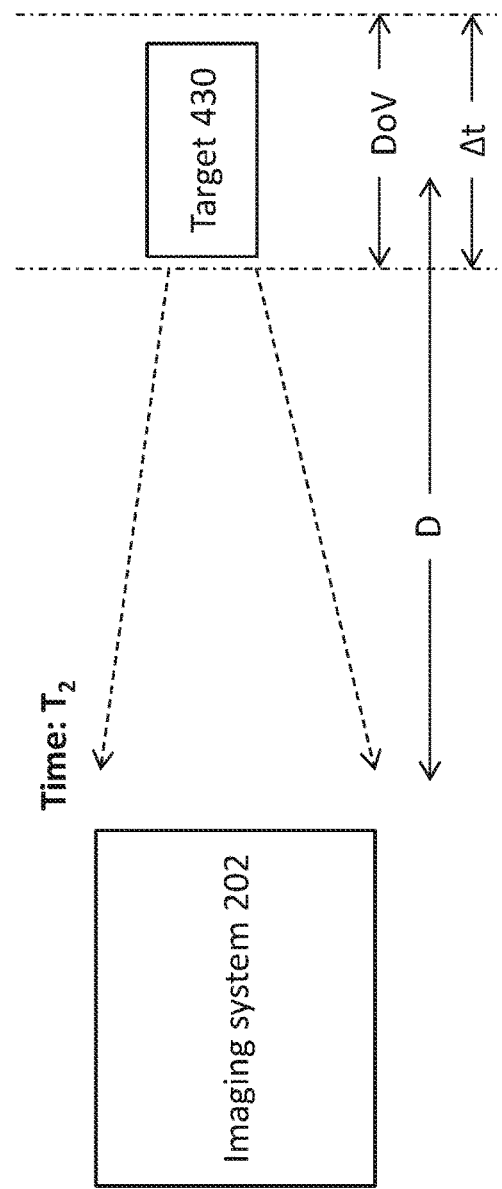

US 10,978,600 B1

SYSTEMS AND METHODS FOR ACTIVE SWIR IMAGING USING GERMANIUM RECEIVERS

FIELD

Embodiments disclosed herein relate to systems and methods for active SWIR imaging with high SNR using germanium (Ge) photodiode based receivers.

BACKGROUND

Short-wave infrared (SWIR) imaging enables a range of applications that are difficult to perform using imaging of visible light. Applications include: electronic board inspection, solar cell inspection, produce inspection, gated imaging, identifying and sorting, surveillance, anti-counterfeiting, process quality control, and much more.

Gated imaging enables viewing of a target in a desired range while avoiding reflections from other objects such as particles in the atmosphere that would otherwise cause backscattering that would prevent viewing of the target area beyond. The technology promises the ability to see through fog, sand, haze, dust, and mist or in contrasted lighting conditions and thus could be a useful part of autonomous-driving and ADAS (advanced driving assisted systems) applications. Gated imaging using SWIR wavelengths allows pulsed laser powers that are significantly higher than the equivalent length pulses in near-infrared (NIR) bands without exceeding eye-safety limits.

SWIR imaging is typically accomplished using InGaAs-based receivers. These InGaAs receivers are expensive to fabricate, and currently suffer from limited manufacturing capacity.

It would therefore be advantageous to be able to provide SWIR imaging systems using more cost-effective photoreceivers based on photodiodes (PDs) that are more easily integrated into the surrounding electronics.

SUMMARY

Exemplary embodiments disclosed herein relate to a system and method for high SNR (signal to noise ratio) active SWIR imaging using receivers comprising Ge based PDs. The major advantage of Ge receiver technology, as compared to InGaAs technology is the compatibility with CMOS processes, allowing manufacture of the receiver as part of a CMOS production line. For example, Ge PDs can be integrated into CMOS processes by growing Ge epilayers on a silicon (Si) substrate, such as in Si photonics. Ge PDs are also therefore more cost effective than equivalent InGaAs photoreceivers.

In order to utilize Ge PDs, the present system is adapted to overcome the limitation of the relatively high dark current of Ge diodes, typically in the ~50 uA/cm^2 range. The dark-current issue is overcome by use of active imaging having a combination of short capture time and high-power laser pulses.

For a given laser pulse energy, the signal to noise ratio (SNR) is mostly dictated by the shot noise of the (dark) photocurrent and/or kTC (thermal) noise. As shown in the exemplary graph of FIG. 1, either of the dark current noise or kTC noise are dominant in effecting the SNR depending on the integration time of the Ge-based receiver. Since the Ge photodetector as proposed herein is operational for a short time (within the range designated as "A" in FIG. 1), not many electrons originating from dark current noise are collected and the SNR is therefore improved and is thus affected mainly by the kTC noise. For a longer pulse duration and associated receiver integration time, the shot noise originating from the dark current of the Ge photodetector becomes dominant over the kTC noise in affecting the receiver SNR, resulting in degraded receiver performance.

In active imaging scenarios, a light source, e.g. laser, is used in combination with an array of photoreceivers. Since the Ge PD operates in the SWIR band, high power light pulses are feasible without exceeding eye safety regulations. For implementations in automotive scenarios, a typical pulse length is ~100 ns, although, in some embodiments, longer pulse durations of up to about 1 microsecond are also anticipated. Considering eye safety, a peak pulse power of ~300 KW is allowable, but this level cannot practically be achieved by current laser diodes. In the present system the high power pulses are therefore generated by a Q-switched (QS) laser. In some embodiments, the laser is passively Q-switched to further reduce costs. In some embodiments, the laser is actively Q-switched.

The present system therefore inventively provides a high-SNR SWIR-band active imaging device based on the combination of an easily integrated, cost effective Ge photoreceiver array, and a QS laser.

As used herein the term "target" refers to any of an imaged entity, object, area, or scene. Non-limiting examples of targets in automotive applications include vehicles, pedestrians, physical barriers or other objects.

According to some embodiments, an active imaging system comprises: an illumination source for emitting a radiation pulse towards a target resulting in reflected radiation from the target, wherein the illumination source comprises a Q-switched (QS) laser; and a receiver comprising one or more germanium (Ge) photodiodes (PDs) for receiving the reflected radiation. In some embodiments, the illumination source operates in the shortwave infrared (SWIR) spectral band.

In some embodiments, the QS laser is an active QS laser. In some embodiments, the QS laser is a passive QS laser. In some embodiments, the passive QS laser comprises a saturable absorber. In some embodiments, the saturable absorber is selected from the group consisting of: Co2+:MgAl2O4, Co2+:Spinel, Co2+:ZnSe and other cobalt-doped crystals, V3+:YAG, doped glasses, quantum dots, semiconductor saturable absorber mirror (SESAM), and Cr4+YAG saturable absorber.

In some embodiments, the system further comprises a QS pulse photodetector for detecting of a radiation pulse emitted by the passive QS laser. In some embodiments, the receiver is configured to be activated at a time sufficient for the radiation pulse to travel to a target and return to the receiver. In some embodiments, the receiver is activated for an integration time during which the dark current power of the Ge PD does not exceed the kTC noise power of the Ge PD.

In some embodiments, the receiver produces electrical signals in response to the reflected radiation received by the Ge PDs, wherein the electrical signals are representative of imagery of the target illuminated by the radiation pulse. In some embodiments, the electrical signals are processed by one of an internal image processor or an external image processor into an image of the target. In some embodiments, the image of the target is processed to provide one or more of forward collision warning, lane departure warning, traffic sign recognition, and detection of pedestrians or oncoming vehicles.

According to further embodiments, a method for performing active imaging comprises: releasing a light pulse by an illumination source comprising an active Q-switch (QS) laser; and after a time sufficient for the light pulse to travel to a target and return to the QS laser, activating a receiver comprising one or more Ge photodiodes (PDs) for a limited time period for receiving a reflected light pulse reflected from the target. In some embodiments, the illumination source operates in the shortwave infrared (SWIR) spectral band. In some embodiments, the limited time period is equivalent to an integration time during which a dark current power of the Ge PD does not exceed a kTC noise power of the Ge PD.

In some embodiments, the receiver produces electrical signals in response to the reflected light pulse received by the Ge PDs wherein the electrical signals are representative of imagery of the target illuminated by the light pulse. In some embodiments, the electrical signals are processed by one of an internal image processor or an external image processor into an image of the target. In some embodiments, the image of the target is processed to provide one or more of forward collision warning, lane departure warning, traffic sign recognition, and detection of pedestrians or oncoming vehicles.

According to further embodiments, a method for performing active imaging comprises: pumping a passive Q-switch (QS) laser comprising a saturable absorber to cause release of a light pulse when the saturable absorber is saturated; detecting the release of the light pulse by a QS pulse photodetector; and after a time sufficient for the light pulse to travel to a target and return to the QS laser based on the detected light pulse release, activating a receiver comprising one or more germanium (Ge) photodiodes (PDs) for a limited time period for receiving the reflected light pulse. In some embodiments, the QS laser operates in the shortwave infrared (SWIR) spectral band.

In some embodiments, the saturable absorber is selected from the group consisting of Co2+:MgAl2O4, Co2+:Spinel, Co2+:ZnSe, other cobalt-doped crystals, V3+:YAG, doped glasses, quantum dots, semiconductor saturable absorber mirror (SESAM) and Cr4+YAG saturable absorber. In some embodiments, the limited time period is equivalent to an integration time during which the dark current power of the Ge PD does not exceed the kTC noise power of the Ge PD.

In some embodiments, the receiver produces electrical signals in response to the reflected light pulse received by the Ge PDs wherein the electrical signals are representative of imagery of the target illuminated by the light pulse. In some embodiments, the electrical signals are processed by one of an internal image processor or an external image processor into an image of the target. In some embodiments, the image of the target is processed to provide one or more of forward collision warning, lane departure warning, traffic sign recognition, and detection of pedestrians or oncoming vehicles.

Unless otherwise defined, all technical and scientific terms used herein have the same meaning as commonly understood by one of ordinary skill in the art to which this-disclosure belongs. The materials, methods, and examples provided herein are illustrative only and not intended to be limiting.

Implementation of the method and system of the present disclosure involves performing or completing certain selected tasks or steps manually, automatically, or a combination thereof. Moreover, according to actual instrumentation and equipment of preferred embodiments of the method and system of the present disclosure, several selected steps could be implemented by hardware or by software on any operating system of any firmware or a combination thereof. For example, as hardware, selected steps of the disclosure could be implemented as a chip or a circuit. As software, selected steps of the disclosure could be implemented as a plurality of software instructions being executed by a computer using any suitable operating system. In any case, selected steps of the method and system of the disclosure could be described as being performed by a data processor, such as a computing platform for executing a plurality of instructions.

Although the present disclosure is described with regard to a "computing device", a "computer", or "mobile device", it should be noted that optionally any device featuring a data processor and the ability to execute one or more instructions may be described as a computer, including but not limited to any type of personal computer (PC), a server, a distributed server, a virtual server, a cloud computing platform, a cellular telephone, an IP telephone, a smartphone, or a PDA (personal digital assistant). Any two or more of such devices in communication with each other may optionally form a "computer network".

BRIEF DESCRIPTION OF THE DRAWINGS

Aspects, embodiments and features disclosed herein will become apparent from the following detailed description when considered in conjunction with the accompanying drawings. Like elements may be numbered with like numerals in different FIGS:

FIG. 4A and FIGS. 4B-4C show respectively a flowchart and schematic drawings of an exemplary method of operation of a SWIR active imaging system according to some embodiments.

DETAILED DESCRIPTION

Exemplary embodiments relate to a system and method for high SNR active SWIR imaging using Ge based PDs. In some embodiments, the imaging system is a gated imaging system. In some embodiments, the pulsed illumination source is an active or passive Q-switched (QS) laser.

Figure 1:
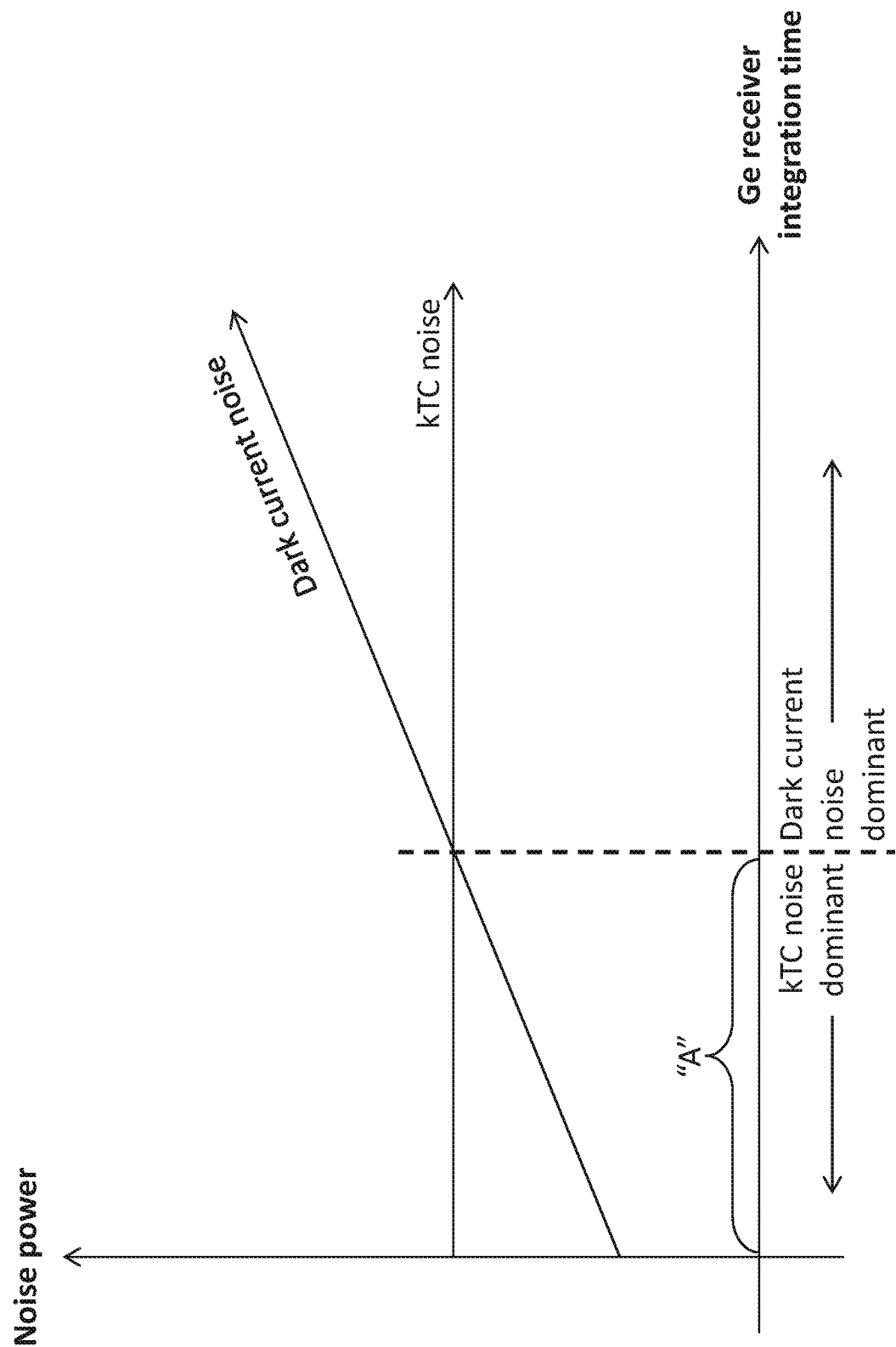
FIG. 1 shows an exemplary graph of the relationship between receiver integration time and noise power.
Figure 2A:
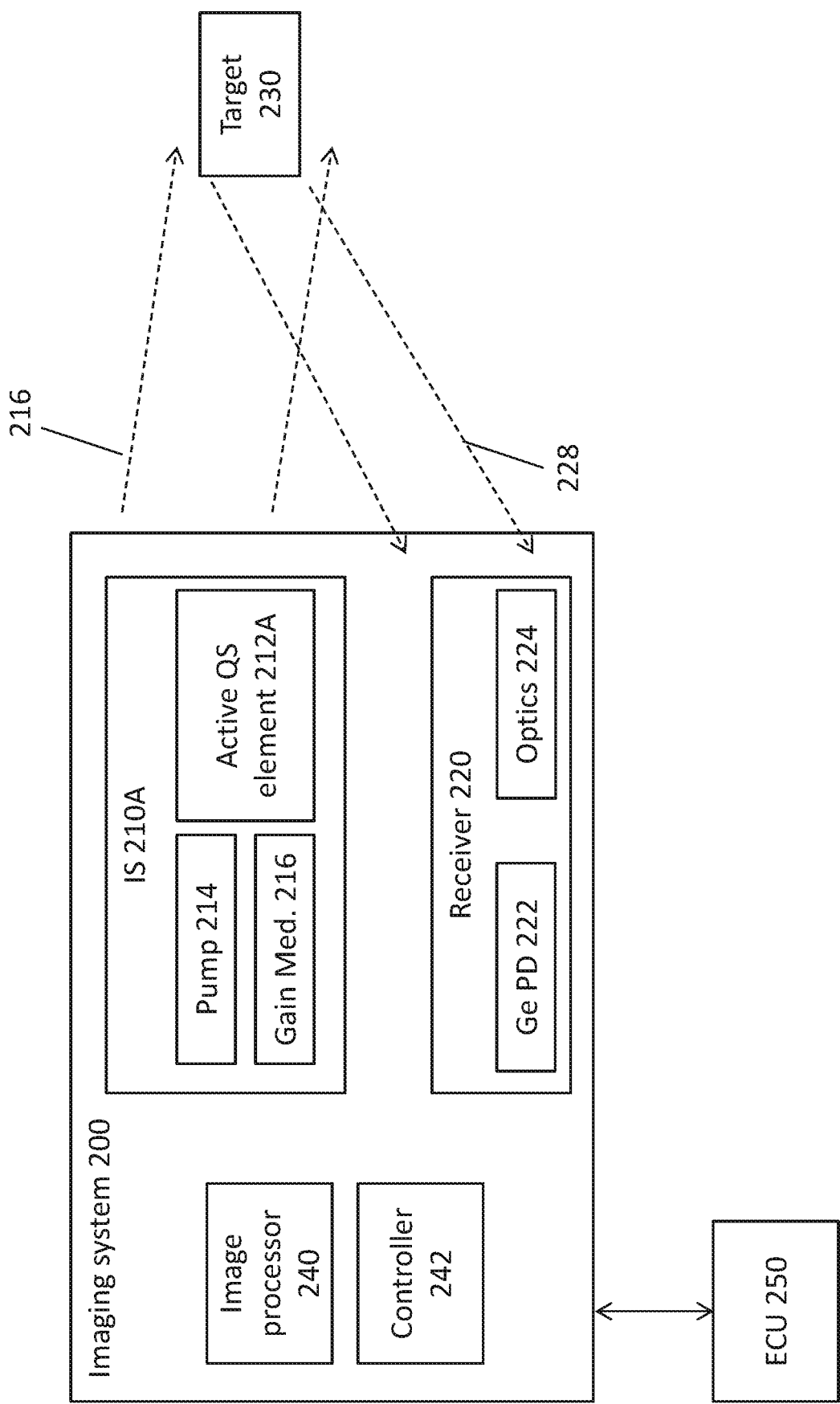
FIGS. 2A and 2B illustrate schematically embodiments of an imaging system according to some embodiments.
Figure 2B:
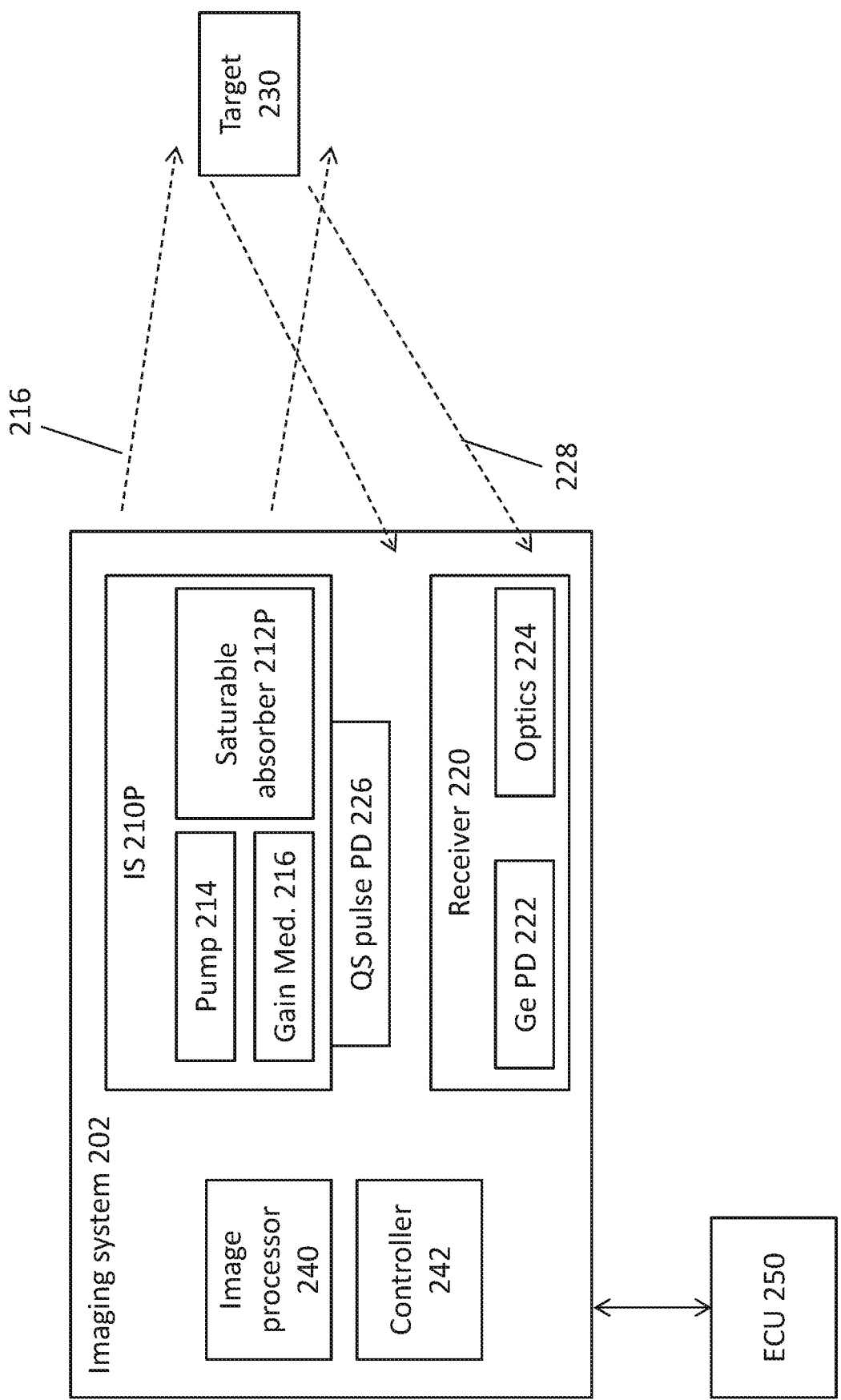

Reference is now made to FIGS. 2A and 2B that illustrate schematically embodiments of an active SWIR imaging system according to some embodiments. Imaging systems 200 and 202 as shown in FIGS. 2A and 2B comprise an illumination source (IS) 210 for illuminating an object, area, or scene, all herein referred to as a target 230, and a receiver 220 for receiving and collecting radiation reflected from target 230. In some embodiments, imaging systems 200 and 202 further comprise an image processor 240. In some embodiments, processing of the output of receiver 220 may be performed by image processor 240 and additionally or alternatively by an external image processor (not shown).

In some embodiments, imaging systems 200 and 202 further comprise a controller 242 for controlling operation of imaging systems 200 and 202 and their components. Controller 242 is a computing device. In some embodiments, the functions of controller 242 are provided within IS 210 and receiver 220, and controller 242 is not required. In some embodiments, the control of imaging systems 200 and 202 is performed by controller 242, IS 210 and receiver 220 acting together. Additionally or alternatively, in some embodiments, control of imaging systems 200 and 202 is performed (or performed supplementally) by an external controller such as a vehicle Electronic Control Unit (ECU) 250.

IS 210 is configured to emit a light pulse 216 that is in the infrared region of the electromagnetic spectrum. More particularly, light pulse 216 is in the shortwave infrared (SWIR) spectral band including wavelengths in a range from approximately 1.3 µm to 3.0 µm.

In some embodiments, such as shown in FIG. 2A, IS 210A is an active QS laser comprising a gain medium 216, a pump 214, mirrors (not shown), and an active QS element 212A. In some embodiments, QS element 212A is a modulator. Following electronic or optical pumping of the gain medium 216 by pump 214, a light pulse is released by active triggering of QS element 212A.

In some embodiments, such as shown in FIG. 2B, IS 210P is a passive QS laser comprising a gain medium 216, pump 214, mirrors (not shown), and a saturable absorber 212P. Saturable absorber 212P allows the laser cavity to store light energy (from pumping of gain medium 216 by pump 214) until a saturated level is reached in saturable absorber 212P, after which a "passive QS" light pulse is released. In order to detect the release of the passive QS pulse, a QS pulse photodetector 226 is coupled to IS 210P. In some embodiments, QS pulse photodetector 226 is a Ge photodetector. The signal from QS pulse photodetector 226 is used to trigger the receive process in receiver 220 such that receiver 220 will be activated after a time period suitable for the target 230 distance to be imaged. The time period is derived as described further below with reference to FIGS. 3B, 3C, 4B and 4C.

In some embodiments, the laser pulse duration from IS 220 is in the range from 100 psec to 1 microsecond. In some embodiments, laser pulse energy is in the range from 10 microjoules to 100 milijoule. In some embodiments, the laser pulse period is of the order of 100 microseconds. In some embodiments, the laser pulse period is in a range from 1 microsecond to 100 milliseconds.

Gain medium 216 is provided in the form of a crystal or alternatively in a ceramic form. Non-limiting examples of materials that can be used for gain medium 216 include: Nd:YAG, Nd:YVO4, Nd:YLF, Nd:Glass, Nd:GdVO4, Nd:GGG, Nd:KGW, Nd:KYW, Nd:YALO, Nd:YAP, Nd:LSB, Nd:S-FAP, Nd:Cr:GSGG, Nd:Cr:YSGG, Nd:YSAG, Nd:Y2O3, Nd:Sc2O3, Er:Glass, Er:YAG, and so forth. In some embodiments, doping levels of the gain medium can be varied based on the need for a specific gain. Non-limiting examples of saturable absorbers 212P include: Co2+:MgAl2O4, Co2+:Spinel, Co2+:ZnSe and other cobalt-doped crystals, V3+:YAG, doped glasses, quantum dots, semiconductor saturable absorber mirror (SESAM), Cr4+YAG saturable absorber and so forth.

Imaging receiver 220 comprises one or more Ge PDs 222 and receiver optics 224. In some embodiments, receiver 220 comprises a 2D array of Ge PDs 222. Imaging receiver 220 is selected to be sensitive to infrared radiation, including at least the wavelengths transmitted by IS 210, such that the imaging receiver may form imagery of the illuminated target 230 from reflected radiation 228.

The receiver optics 224 may include one or more optical elements, such as mirrors or lenses that are arranged to collect, concentrate and optionally filter the reflected electromagnetic radiation 228, and focus the electromagnetic radiation onto a focal plane of the imaging receiver 220.

Receiver 220 produces electrical signals in response to electromagnetic radiation detected by one or more of Ge PD 222 representative of imagery of the illuminated scene. Signals detected by receiver 220 can be transferred to an internal image processor 240 or external image processor (not shown) for processing into a SWIR image of the target 230. In some embodiments, receiver 220 is activated multiple times to create "time slices" each covering a specific distance range. In some embodiments, image processor 240 combines these slices to create a single image with greater visual depth such as proposed by Gruber, Tobias, et al. "Gated2depth: Real-time dense LIDAR from gated images." arXiv preprint arXiv:1902.04997 (2019), which is incorporated herein by reference in its entirety.

In some embodiments, receiver 220 has the following specifications:
HFOV (horizontal field of view) [m]: 60
WD (working distance) [m]: 150
Pixel Size [um]: 10
Resolution (on Obj.) [mm]: 58
Pixels #[H]: 1,050
Pixels #[V]: 660
Aspect Ratio: 3:1
View Angle [rad]: 0.4
Reflectivity of the target [%]: 10%
Collection (the ratio of collected photons to emitted photons assuming target reflectivity of 100% and assuming Lambertian reflectance): $3e^{-9}$ In the automotive field, the generated image from imaging systems 200 or 202 of the target 230 within the field of view (FOV) of receiver 220 may be processed to provide various driver assistance and safety features, such as: forward collision warning (FCW), lane departure warning (LDW), traffic sign recognition (TSR), and the detection of relevant entities such as pedestrians or oncoming vehicles. The generated image may also be displayed to the driver, for example projected on a head-up display (HUD) on the vehicle windshield. Additionally or alternatively imaging systems 200 or 202 may interface to a vehicle ECU 250 for providing images or video to enable autonomous driving at low light levels or in poor visibility conditions.

Figure 3A:
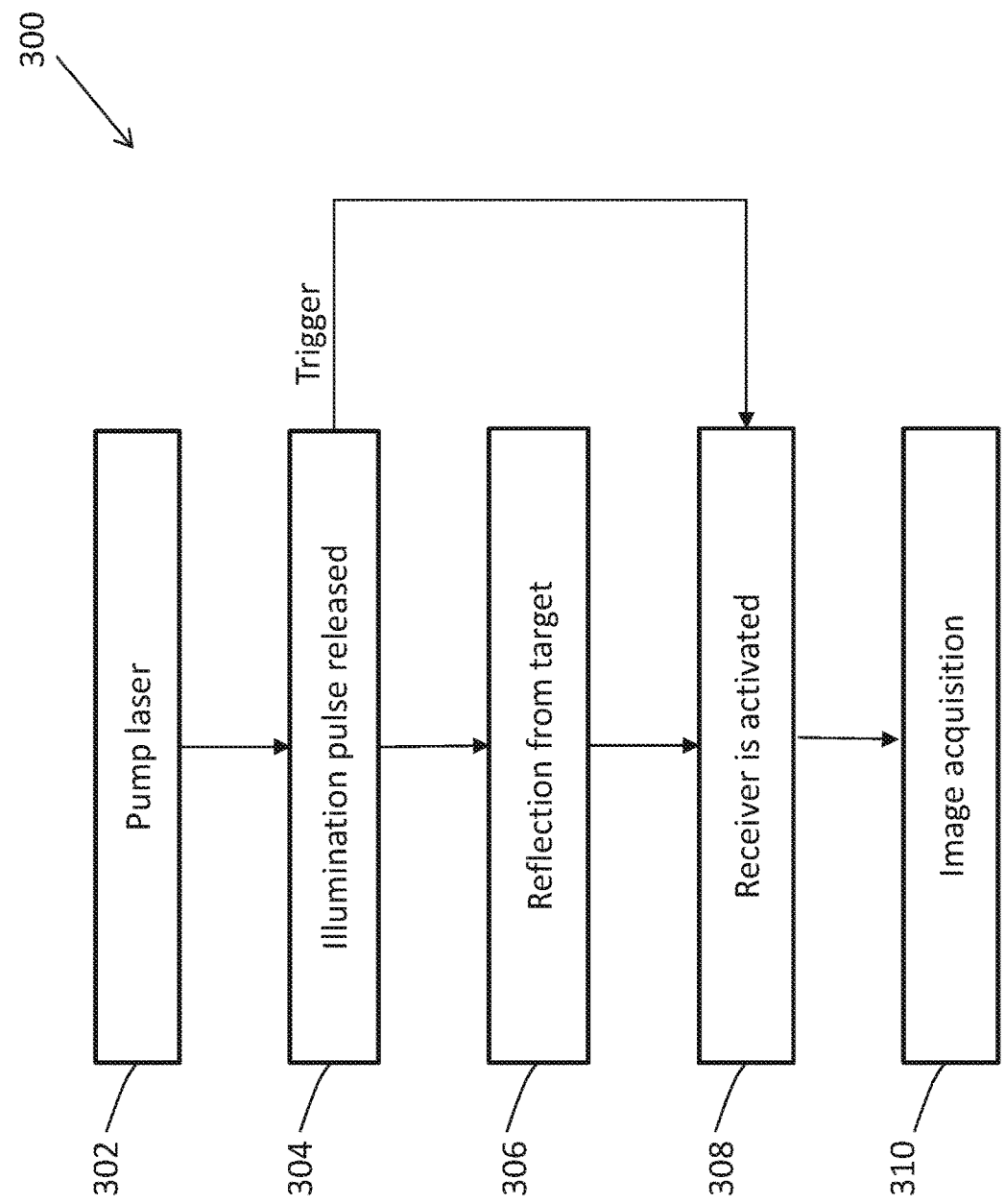
FIG. 3A and FIGS. 3B-3C show respectively a flowchart and schematic drawings of a method of operation of a SWIR active imaging system according to some embodiments.
Figure 3B:
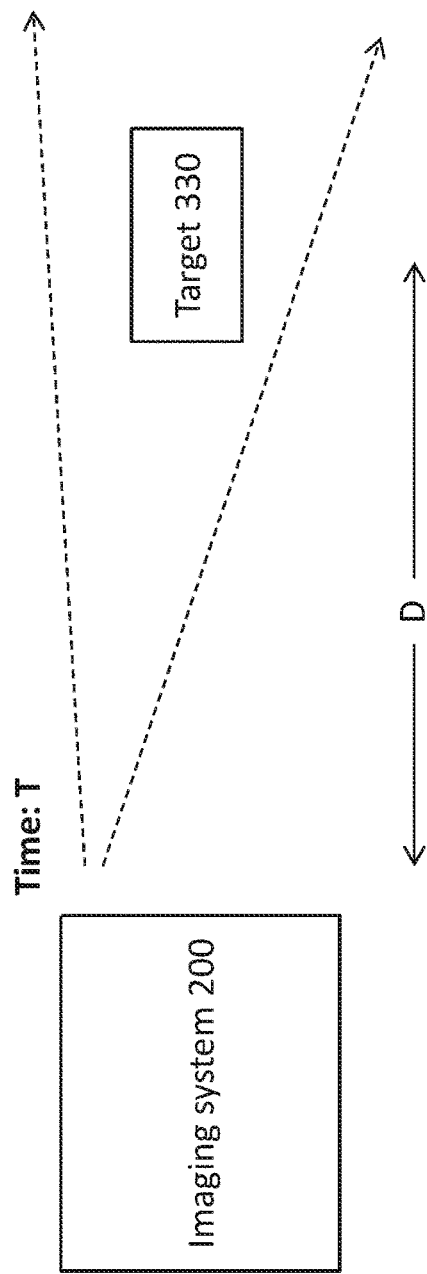
Figure 3C:
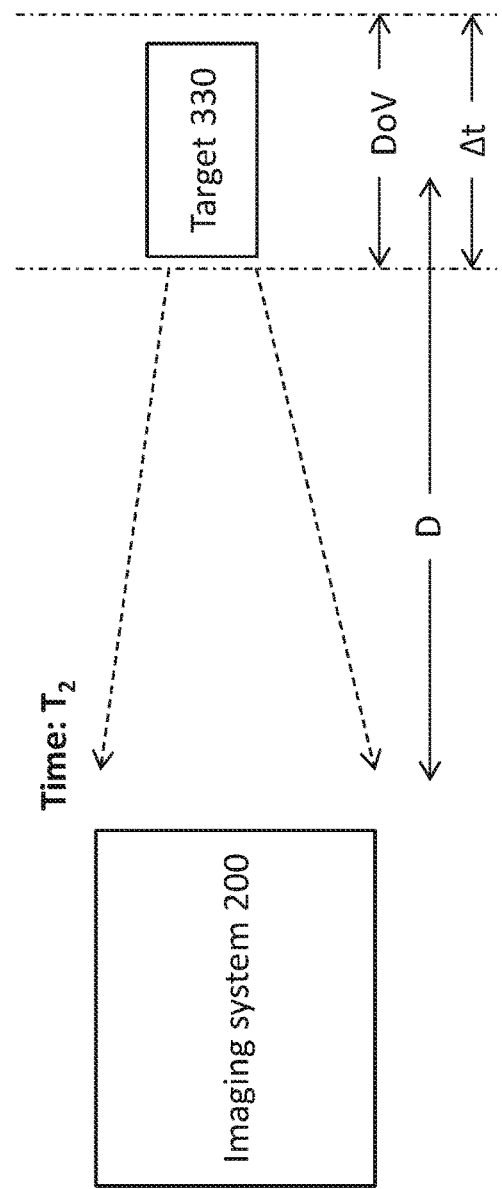

Reference is now made to FIG. 3A and FIGS. 3B-3C showing respectively a flowchart and schematic drawings of a method of operation of an active SWIR imaging system according to some embodiments. The process 300 shown in FIG. 3A is based on system 200 as described with reference to FIG. 2A. In step 302, pump 214 of IS 210A is activated to pump gain medium 216. In step 304, active QS element 212A releases a light pulse in the direction of a target 330 that is at a distance of D. In step 306, at Time=T, the light pulse strikes target 330 and generates reflected radiation back towards system 200 and receiver 220. In step 308, after waiting a time=$T_2$, receiver 220 is activated to receive the reflected radiation. The return propagation delay $T_2$ consists of the flight time of the pulse from IS 210A to target 330 plus the flight time of the optical signal reflected from target 330. $T_2$ is therefore known for a target 330 at a distance "D" from the IS 210A and receiver 220. The activation period of receiver 220 $\Delta t$ is determined based on the required depth of view (DoV). The DoV is given by 2DoV=$c*\Delta t$ where c is the speed of light. A typical $\Delta t$ of 100 ns provides a depth of view of 15 meters. In step 310, the reflected radiation is received by receiver 220 for a period of $\Delta t$. The received data from receiver 220 is processed by image processor 240 (or an external image processor) to generate a received image. Process 300 can be repeated N times in each frame where a frame is defined as the data set transferred from receiver 220 to image processor 240 (or an external image processor). In some embodiments, N is between 1 and 10,000.

Figure 4A:
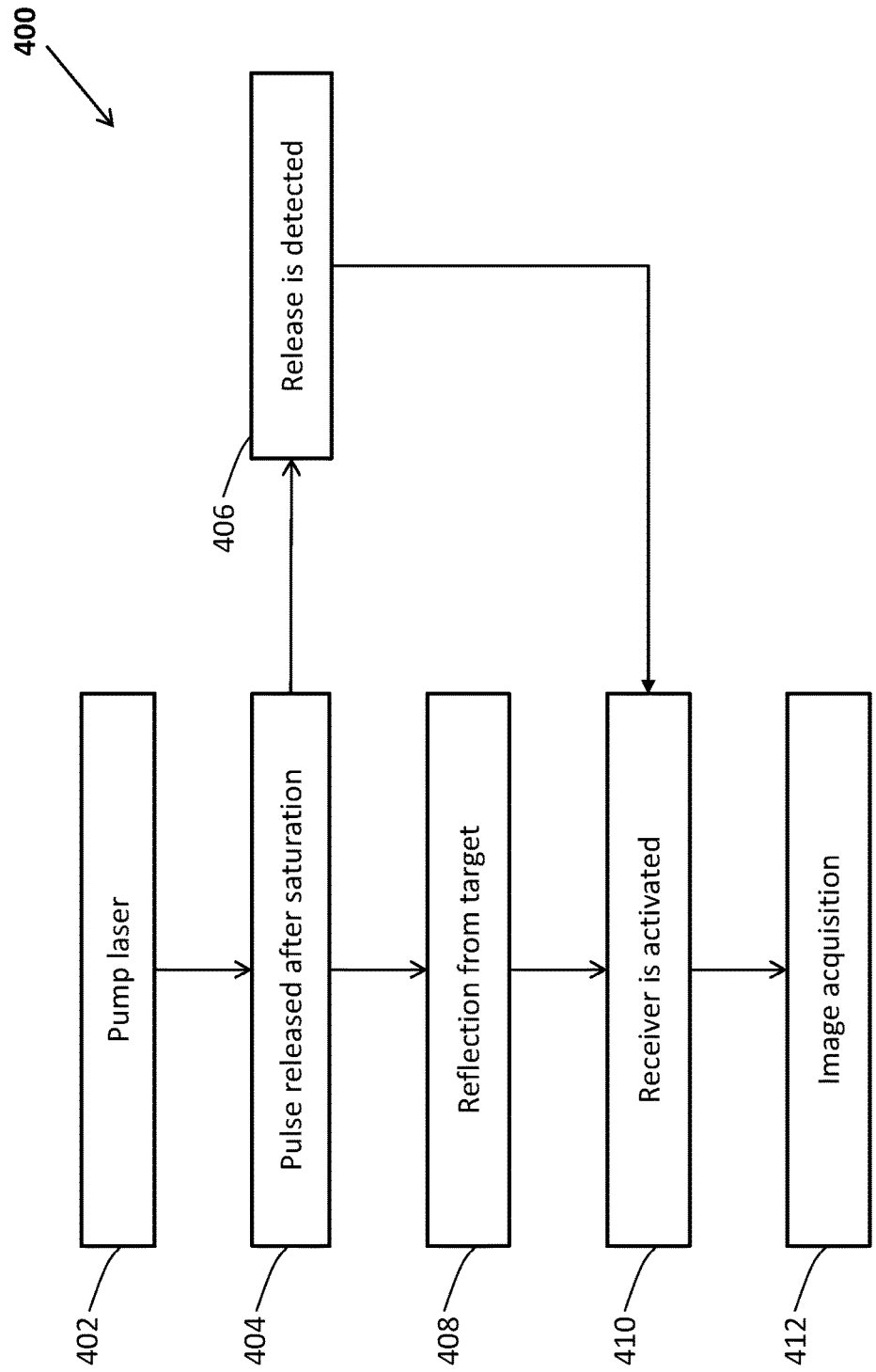

Reference is now made to FIG. 4A and FIGS. 4B-4C showing respectively a flowchart and schematic drawings of an exemplary method of operation of an active SWIR imaging system according to some embodiments. The process 400 shown in FIG. 4A is based on system 202 as described with reference to FIG. 2B. In step 402, pump 214 of IS 210P is activated to pump gain medium 216 and to saturate saturable absorber 212P. In step 404, after reaching a saturation level, saturable absorber 212P releases a light pulse in the direction of a target 430 at a distance of D. In step 406, QS pulse photodetector 226 detects the released light pulse. In step 408, at Time=T, the light pulse strikes target 430 and generates reflected radiation back towards system 202 and receiver 220. In step 410, after waiting a time=$T_2$ following the detection of a released light pulse by QS pulse photodetector 226, receiver 220 is activated to receive the reflected radiation. The return propagation delay $T_2$ comprises the flight time of the pulse from IS 210P to target 430 plus the flight time of the optical signal reflected from target 430. $T_2$ is therefore known for a target 430 at a distance "D" from the IS 210P and receiver 220. The activation period of Δt is determined based on the required depth of view (DoV). In step 412, the reflected radiation is received by receiver 220 for a period of Δt. The received data from receiver 220 is processed by image processor 240 (or an external processor) to generate a received image. Process 400 can be repeated N times in each frame where a frame is defined as the data set transferred from receiver 220 to image processor 240 (or an external image processor). In some embodiments, N is between 1 and 10,000.

In the claims or specification of the present application, unless otherwise stated, adjectives such as "substantially" and "about" modifying a condition or relationship characteristic of a feature or features of an embodiment, are understood to mean that the condition or characteristic is defined to within tolerances that are acceptable for operation of the embodiment for an application for which it is intended.

It should be understood that where the claims or specification refer to "a" or "an" element, such reference is not to be construed as there being only one of that element.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

While this disclosure describes a limited number of embodiments, it will be appreciated that many variations, modifications and other applications of such embodiments may be made. The disclosure is to be understood as not limited by the specific embodiments described herein, but only by the scope of the appended claims.

What is claimed is:

1. An active imaging system comprising:
    a) an imaging system illumination source for emitting a radiation pulse towards a target resulting in reflected radiation from the target, wherein the illumination source comprises a Q-switched (QS) laser; and
    b) a receiver comprising one or more germanium (Ge) photodiodes (PDs) for receiving the reflected radiation wherein the receiver is configured to be activated for an integration period during which the dark current power of the Ge PDs does not exceed the kTC noise power of the Ge PDs and to be deactivated after the integration period ends.

2. The system of claim 1, wherein the illumination source operates in the shortwave infrared (SWIR) spectral band.

3. The system of claim 2, wherein the QS laser is an active QS laser.

4. The system of claim 2, wherein the QS laser is a passive QS laser.

5. The system of claim 4, wherein the passive QS laser comprises a saturable absorber.

6. The system of claim 5, wherein the saturable absorber is selected from the group consisting of: $Co2+:MgAl2O4$, $Co2+:Spinel$, $Co2+:ZnSe$ and other cobalt-doped crystals, $V^{3+}:YAG$, doped glasses, quantum dots, semiconductor saturable absorber mirror (SESAM), and $Cr4+YAG$ saturable absorber.

7. The system of claim 4, further comprising a QS pulse photodetector for detecting of a radiation pulse emitted by the passive QS laser.

8. The system of claim 1, wherein the receiver is configured to be activated at a time sufficient for the radiation pulse to travel to a target and return to the receiver.

9. The system of claim 1, wherein the receiver produces electrical signals in response to the reflected radiation received by the Ge PDs, wherein the electrical signals are representative of imagery of the target illuminated by the radiation pulse.

10. The system of claim 9, wherein the electrical signals are processed by one of an internal image processor or an external image processor into an image of the target.

11. The system of claim 10, wherein the image of the target is processed to provide one or more of forward collision warning, lane departure warning, traffic sign recognition, and detection of pedestrians or oncoming vehicles.

12. A method for performing active imaging comprising:
    a) releasing a light pulse by an illumination source of an imaging system comprising an active Q-switch (QS) laser;
    b) after a time sufficient for the light pulse to travel to a target and return to the QS laser, activating a receiver comprising one or more Ge photodiodes (PDs) for an integration period during which a dark current power of the Ge PDs does not exceed a kTC noise power of the Ge PDs for receiving a reflected light pulse reflected from the target; and
    c) deactivating the receiver after the integration period ends.

13. The method of claim 12, wherein the illumination source operates in the shortwave infrared (SWIR) spectral band.

14. The method of claim 12, wherein the receiver produces electrical signals in response to the reflected light pulse received by the Ge PDs wherein the electrical signals are representative of imagery of the target illuminated by the light pulse.

15. The method of claim 14, wherein the electrical signals are processed by one of an internal image processor or an external image processor into an image of the target.

16. The method of claim 15, wherein the image of the target is processed to provide one or more of forward collision warning, lane departure warning, traffic sign recognition, and detection of pedestrians or oncoming vehicles.

17. A method for performing active imaging comprising:
    a) pumping a passive Q-switch (QS) laser comprising a saturable absorber to cause release of a light pulse when the saturable absorber is saturated;

b) detecting the release of the light pulse by a QS pulse photodetector;
c) after a time sufficient for the light pulse to travel to a target and return to the QS laser based on the detected light pulse release, activating a receiver comprising one or more germanium (Ge) photodiodes (PDs) for an integration period during which the dark current power of the Ge PDs does not exceed the kTC noise power of the Ge PDs for receiving the reflected light pulse; and
d) deactivating the receiver after the integration period ends.

18. The method of claim 17, wherein the QS laser operates in the shortwave infrared (SWIR) spectral band.

19. The method of claim 17, wherein the saturable absorber is selected from the group consisting of Co2+:MgAl2O4, Co2+:Spinel, Co2+:ZnSe, other cobalt-doped crystals, $V^{3+}$:YAG, doped glasses, quantum dots, semiconductor saturable absorber mirror (SESAM) and Cr4+YAG saturable absorber.

20. The method of claim 17, wherein the receiver produces electrical signals in response to the reflected light pulse received by the Ge PDs wherein the electrical signals are representative of imagery of the target illuminated by the light pulse.

21. The method of claim 20, wherein the electrical signals are processed by one of an internal image processor or an external image processor into an image of the target.

22. The method of claim 21, wherein the image of the target is processed to provide one or more of forward collision warning, lane departure warning, traffic sign recognition, and detection of pedestrians or oncoming vehicles.

* * * * *